US008338316B2

(12) United States Patent
Parihar et al.

(10) Patent No.: US 8,338,316 B2
(45) Date of Patent: Dec. 25, 2012

(54) LOW TEMPERATURE PROCESS FOR DEPOSITING A HIGH EXTINCTION COEFFICIENT NON-PEELING OPTICAL ABSORBER FOR A SCANNING LASER SURFACE ANNEAL OF IMPLANTED DOPANTS

(75) Inventors: Vijay Parihar, Fremont, CA (US); Christopher Dennis Bencher, San Jose, CA (US); Rajesh Kanuri, Santa Clara, CA (US); Marlon E. Menezes, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/111,306

(22) Filed: May 19, 2011

(65) Prior Publication Data
US 2011/0223773 A1 Sep. 15, 2011

Related U.S. Application Data

(62) Division of application No. 11/697,267, filed on Apr. 5, 2007, now Pat. No. 7,968,473.

(60) Provisional application No. 60/856,621, filed on Nov. 3, 2006.

(51) Int. Cl.
*H01L 21/00* (2006.01)
(52) U.S. Cl. ............ 438/795; 438/82; 438/95; 438/301; 438/302; 438/303; 257/E21.218; 257/E21.041
(58) Field of Classification Search .......... 438/301–303, 438/82, 99, 795; 257/E21.218, E21.041, 257/E21.049
See application file for complete search history.

(56) References Cited

U.S. PATENT DOCUMENTS

| 5,017,264 | A | 5/1991 | Yamazaki et al. |
| 5,202,156 | A | 4/1993 | Yamamoto et al. |
| 5,563,092 | A | 10/1996 | Ohmi |
| 6,042,993 | A | 3/2000 | Leuschner et al. |
| 6,073,404 | A | 6/2000 | Norfleet |
| 6,100,628 | A * | 8/2000 | Coll et al. ............ 313/310 |
| 6,149,778 | A | 11/2000 | Jin et al. |
| 6,274,881 | B1 | 8/2001 | Akiyama et al. |
| 6,316,346 | B1 | 11/2001 | Gangopadhyay |
| 6,346,678 | B1 | 2/2002 | Kono et al. |

(Continued)

OTHER PUBLICATIONS

Singh, et al., "Optical and mechanical properties of diamond like carbon films deposited by microwave ECR plasma CVD", Bulletin of Materials Science, Oct. 2008, pp. 813-818.

(Continued)

*Primary Examiner* — N Drew Richards
*Assistant Examiner* — Ankush Singal
(74) *Attorney, Agent, or Firm* — Robert M. Wallace

(57) ABSTRACT

A plasma enhanced physical vapor deposition process deposits an amorphous carbon layer on an ion-implanted wafer for use in dynamic surface annealing of the wafer with an intense line beam of a laser wavelength. The deposition process is carried out at a wafer temperature below the dopant clustering threshold temperature, and includes introducing the wafer into a chamber having a carbon-containing target overlying the wafer, and furnishing a carrier gas into the chamber. The process further includes generating a wafer bias voltage and applying target source power to the carbon-containing target sufficient to produce ion bombardment of the carbon-containing target. The wafer bias voltage is set to a level at which the amorphous carbon layer that is deposited has a desired extinction coefficient at the laser wavelength.

7 Claims, 4 Drawing Sheets

U.S. PATENT DOCUMENTS

| | | |
|---|---|---|
| 6,346,747 B1 | 2/2002 | Grill et al. |
| 6,388,366 B1 * | 5/2002 | Pryor .......................... 313/311 |
| 6,423,384 B1 | 7/2002 | Khazeni et al. |
| 6,424,305 B2 | 7/2002 | Huang et al. |
| 6,428,894 B1 * | 8/2002 | Babich et al. ................. 428/408 |
| 6,475,888 B1 | 11/2002 | Sohn |
| 6,503,578 B1 | 1/2003 | Tseng et al. |
| 6,987,240 B2 | 1/2006 | Jennings et al. |
| 7,015,124 B1 | 3/2006 | Fisher et al. |
| 7,109,087 B2 | 9/2006 | Autryve et al. |
| 7,109,098 B1 | 9/2006 | Ramaswamy et al. |
| 7,312,162 B2 | 12/2007 | Ramaswamy et al. |
| 2004/0092098 A1 | 5/2004 | Sudijono et al. |
| 2005/0074956 A1 * | 4/2005 | Autryve et al. ............... 438/530 |
| 2005/0074986 A1 * | 4/2005 | Autryve et al. ............... 438/795 |
| 2005/0285119 A1 | 12/2005 | Burgener et al. |
| 2006/0228897 A1 * | 10/2006 | Timans ........................ 438/758 |
| 2006/0264060 A1 * | 11/2006 | Ramaswamy et al. ........ 438/758 |
| 2007/0032095 A1 * | 2/2007 | Ramaswamy et al. ........ 438/795 |
| 2007/0093033 A1 | 4/2007 | Wang et al. |
| 2007/0134941 A1 * | 6/2007 | Liu et al. ...................... 438/781 |
| 2007/0251815 A1 | 11/2007 | Lo et al. |
| 2008/0102645 A1 * | 5/2008 | Zhou et al. ................... 438/710 |
| 2008/0108210 A1 | 5/2008 | Parihar et al. |

OTHER PUBLICATIONS

Official Action dated Sep. 26, 2008 issued in corresponding U.S. Appl. No. 11/697,267.

Official Action dated Nov. 24, 2008 issued in corresponding U.S. Appl. No. 11/697,267.

Official Action dated Apr. 15, 2009 issued in corresponding U.S. Appl. No. 11/697,267.

Official Action dated Nov. 13, 2009 issued in corresponding U.S. Appl. No. 11/697,267.

Official Action dated Feb. 3, 2010 issued in corresponding U.S. Appl. No. 11/697,267.

Official Action dated Oct. 27, 2010 issued in corresponding U.S. Appl. No. 11/697,267.

Official Action dated Apr. 11, 2011 issued in corresponding U.S. Appl. No. 11/697,267.

* cited by examiner

LOW TEMPERATURE PROCESS FOR DEPOSITING A HIGH EXTINCTION COEFFICIENT NON-PEELING OPTICAL ABSORBER FOR A SCANNING LASER SURFACE ANNEAL OF IMPLANTED DOPANTS

CROSS-REFERENCE TO RELATED APPLICATIONS

This application is a divisional of U.S. patent application Ser. No. 11/697,267 filed Apr. 5, 2007 now U.S. Pat. No. 7,968,473 entitled A LOW TEMPERATURE PROCESS FOR DEPOSITING A HIGH EXTINCTION COEFFICIENT NON-PEELING OPTICAL ABSORBER FOR A SCANNING LASER SURFACE ANNEAL OF IMPLANTED DOPANTS By Vijay Parihar, et al., which claims the benefit of U.S. Provisional Patent Application Ser. No. 60/856,621 filed Nov. 3, 2006. All of the above applications are hereby incorporated by reference in their entirety.

BACKGROUND OF THE INVENTION

High speed integrated circuits formed on a crystalline semiconductor wafer have ultra shallow semiconductor junctions formed by ion implanting dopant impurities into source and drain regions. The implanted dopant impurities are activated by a high temperature anneal step which causes a large proportion of the implanted atoms to become substitutional in the crystalline semiconductor lattice. Such a post-ion implantation anneal step is performed using a dynamic laser surface anneal process in which a thin line of intense radiation is scanned in a direction transverse to the line across the wafer surface. The scanning rate of the line beam is sufficiently great so that heating of the wafer (to a temperature between 1150 to 1350 degrees C.) is limited to an extremely shallow depth below the surface and to an extremely narrow region corresponding to the thin laser line beam.

The dynamic surface anneal process employs an array of diode lasers whose multiple parallel beams are focused along a narrow line (e.g., about 300 microns wide) having a length less than the wafer diameter or radius. The diode lasers have a wavelength of about 810 nm. The narrow laser beam line is scanned transversely across the wafer surface (e.g., at a rate between 30 mm/sec to 300 mm/sec), so that each point on the wafer surface is exposed for a very short time (e.g., between 0.25 millisec to 5 millisecs). This type of annealing is disclosed in United States Patent Publication No. US 2003/0196996A1 (Oct. 23, 2003) by Dean C. Jennings et al. Each region of the wafer surface reaches a temperature range of about 1150-1300 degrees C. for about 50 microsec to 3 millisec. The depth of this region is about 10-20 microns. This depth is sufficient because it extends well-below the ultra-shallow semiconductor junction depth of about 200 Angstroms. Such a high temperature is sufficient to activate the implanted (dopant) atoms and to anneal lattice damage or defects. Some of these defects like end of range defects may require laser exposure time of 1 millisec to 3 millisec above 1150-1350 degrees C., to fully or to partially resolve end of range defects to a level where their presence does not impact device performance. The optical absorption of the laser radiation must be uniform across the wafer surface for uniform dopant activation.

The problem is that the underlying thin film structures formed on the wafer surface present different optical absorption characteristics and different optical emissivities in different locations on the wafer surface. This makes it difficult if not impossible to attain uniform anneal temperatures across the wafer surface. This problem can be solved by depositing an optical absorption layer over the entire wafer surface that uniformly absorbs the laser radiation and then conducts the heat to the underlying semiconductor wafer. Such a film must withstand the stress of heating during the laser anneal step without damage or separation, and must be selectively removable after the laser anneal step with respect to underlayers and must not contaminate or damage the underlying semiconductor wafer or thin film features. The problem of withstanding stress arises from the thermal expansion of the narrow laser-illuminated portion of the wafer surface. Further, the absorber film must attain excellent step coverage (high degree of conformality) over the underlying thin film features.

An amorphous carbon material is the best choice for the optical absorber layer, as suggested in U.S. Pat. No. 7,262,106 issued Aug. 28, 2007 entitled "Absorber Layer for DSA Processing" by Luc Van Autryve, et al. and assigned to the present assignee, which discloses a plasma enhanced chemical vapor deposition (PECVD) process for depositing the amorphous carbon layer. One advantage of amorphous carbon is that it is readily removed with high selectivity by oxidation at a low wafer temperature. Another advantage is that carbon is generally compatible with semiconductor plasma processes and therefore does not involve contamination, so long as excessive implantation does not occur.

One problem is that the deposited layer is vulnerable to cracking or peeling under the high temperatures of the laser anneal step, unless the layer is deposited at a very high temperature (e.g., 550 degrees C.). Unfortunately, such a high temperature causes clustering of the implanted dopant atoms during the deposition step itself. Such clustered dopant atoms resist separation during the subsequent laser anneal step, limiting the fraction of the implanted atoms that move during the laser anneal step into substitutional sites in the crystal. This results in unacceptably high sheet resistance in the source or drain regions.

These issues are not problems in the fabrication of semiconductor structures with larger (e.g., 65 nm) feature sizes. This is because the greater gate-source overlap (20 nm) permitted for such larger structures can be annealed by conventional thermal (flash lamp) annealing (prior to deposition of the optical absorber layer). This anneal step is then followed by the dynamic surface (laser) anneal step to obtain a fractional improvement in dopant activation. This improvement is limited because the thermal annealing causes a small amount of dopant clustering which the subsequent laser annealing step cannot undo. The 45 nm devices require better dopant activation, which requires elimination of the thermal annealing step and maintaining wafer temperatures below the threshold (475 degrees C.) at which dopant clustering can occur until the laser anneal step is performed. This results in extremely high dopant activation levels and low sheet resistance in the implanted areas, as required for 45 nm device structures. It can be desirable to maintain the wafer temperature below the dopant clustering threshold temperature in the 45 nm process (unlike the 65 nm process) because none of the implanted dopant atoms have been moved into substitutional crystal sites prior to laser annealing (since the thermal annealing step is not permitted), so that elevation of the wafer temperature prior to laser annealing (e.g., during the amorphous carbon layer deposition) may risk clustering more of the dopant atoms, which would make it more difficult to obtain sufficient dopant activation even by laser annealing.

Attempting to avoid this problem by reducing the wafer temperature (e.g., below 475 degrees C.) during PECVD deposition of the absorber layer creates two problems. First, the mechanical properties of the deposited amorphous carbon layer formed at this lower temperature are inferior so that it will fail (by cracking, peeling or separation from the wafer) during the laser annealing step. Secondly, the amorphous carbon layer deposited at the lower temperature has inferior or insufficient optical absorption qualities (low extinction coefficient) at the 810 nm wavelength of the laser anneal step. The lower extinction coefficient requires a thicker optical absorber (amorphous carbon) layer to attain 90-99% absorption of the laser power. The increased thickness increases the susceptibility of the absorber layer to peeling or separation during the dynamic laser anneal step. The extinction coefficient may be so low that the amorphous carbon layer is transparent to the 810 nm laser light regardless of thickness, and therefore is not functional.

What is needed is a low temperature (i.e., less than 475 degrees C.) deposition process which provides an amorphous carbon layer having a high optical extinction coefficient at the wavelength of the laser anneal step (i.e., an extinction coefficient greater than 0.35 at a wavelength of 81 nm) and which is impervious to mechanical failure such as peeling or separation at the temperature of the laser annealing step (e.g., 1150 to 1350 degrees C.), and which has excellent step coverage.

SUMMARY OF THE INVENTION

A plasma enhanced physical vapor deposition process deposits an amorphous carbon layer on an ion-implanted wafer for use in dynamic surface annealing of the wafer with an intense line beam of a laser wavelength. The deposition process is carried out at a wafer temperature below the dopant clustering threshold temperature, and includes introducing the wafer into a chamber having a carbon-containing target overlying the wafer, and furnishing a carrier gas into the chamber. The process further includes generating a wafer bias voltage and applying target source power to the carbon-containing target sufficient to produce ion bombardment. of the carbon-containing target. The wafer bias voltage is set to a level at which the amorphous carbon layer that is deposited has a desired extinction coefficient at the laser wavelength. For an extinction coefficient in excess of 0.5 at a wavelength of 810 nm, the process gas may include an inert gas and the wafer bias should be in a range of about −6 volts to −8 volts. For an extinction coefficient in excess of 0.6 at 810 nm, the nitrogen may be added to the process gas (and/or to the carbon-containing target), which case the bias voltage should be about +10 volts.

BRIEF DESCRIPTION OF THE DRAWINGS

FIG. 5 is an elevational view corresponding to

FIG. 4.

DETAILED DESCRIPTION OF THE INVENTION

Introduction:

We have discovered a process that meets the requirements for ion implantation and annealing of semiconductor structures having 45 nm feature sizes. This process employs ion implantation by suitable conventional processes (e.g., plasma immersion ion implantation and/or beam ion implantation), deposition of an amorphous carbon layer (ACL) for uniform optical absorption followed by dynamic surface annealing by a scanned laser line beam. Our process overcomes the obstacles that have limited the prior art by depositing an ACL at a low wafer temperature (below the dopant clustering threshold temperature) in such a manner that the ACL has a high optical extinction coefficient at the laser wavelength, and has sufficient adhesion and strength to avoid damage during the laser anneal step. We have discovered that deposition of an ACL having a high extinction coefficient at 810 nm capable of withstanding laser annealing is obtained using plasma enhanced physical vapor deposition from a carbon-containing target at a wafer temperature below 475 degrees C. While conventional plasma-enhanced physical vapor deposition processes can employ a wafer bias voltage within a very large range (e.g., 0 to −50 volts), part of our discovery is that the desired extinction coefficient at 810 nm is obtained by confining the wafer bias voltage to a very narrow range during the deposition step, such as between about −6 volts and about −8 volts. This range of bias voltage also optimizes mechanical strength of the amorphous carbon layer, enabling it to withstand the stresses of laser annealing. An additional element for obtaining a high extinction coefficient is limiting the amount of hydrogen in the carbon target or in the carrier gas to a few percent of the target or gas.

Figure 1:
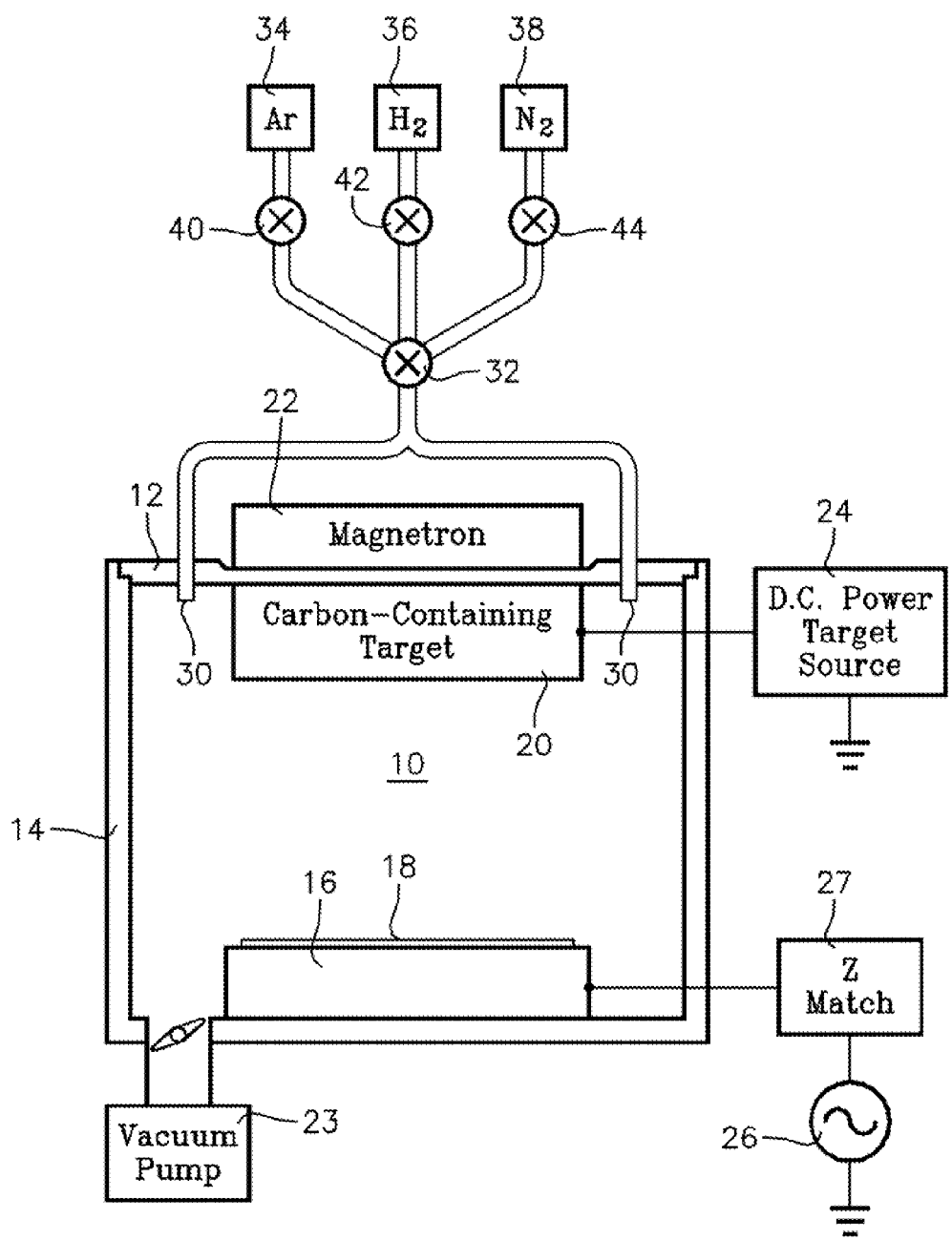
FIG. 1 is a simplified diagram of a physical vapor deposition plasma chamber employed in carrying out some steps in the process of the invention.
Figure 2:
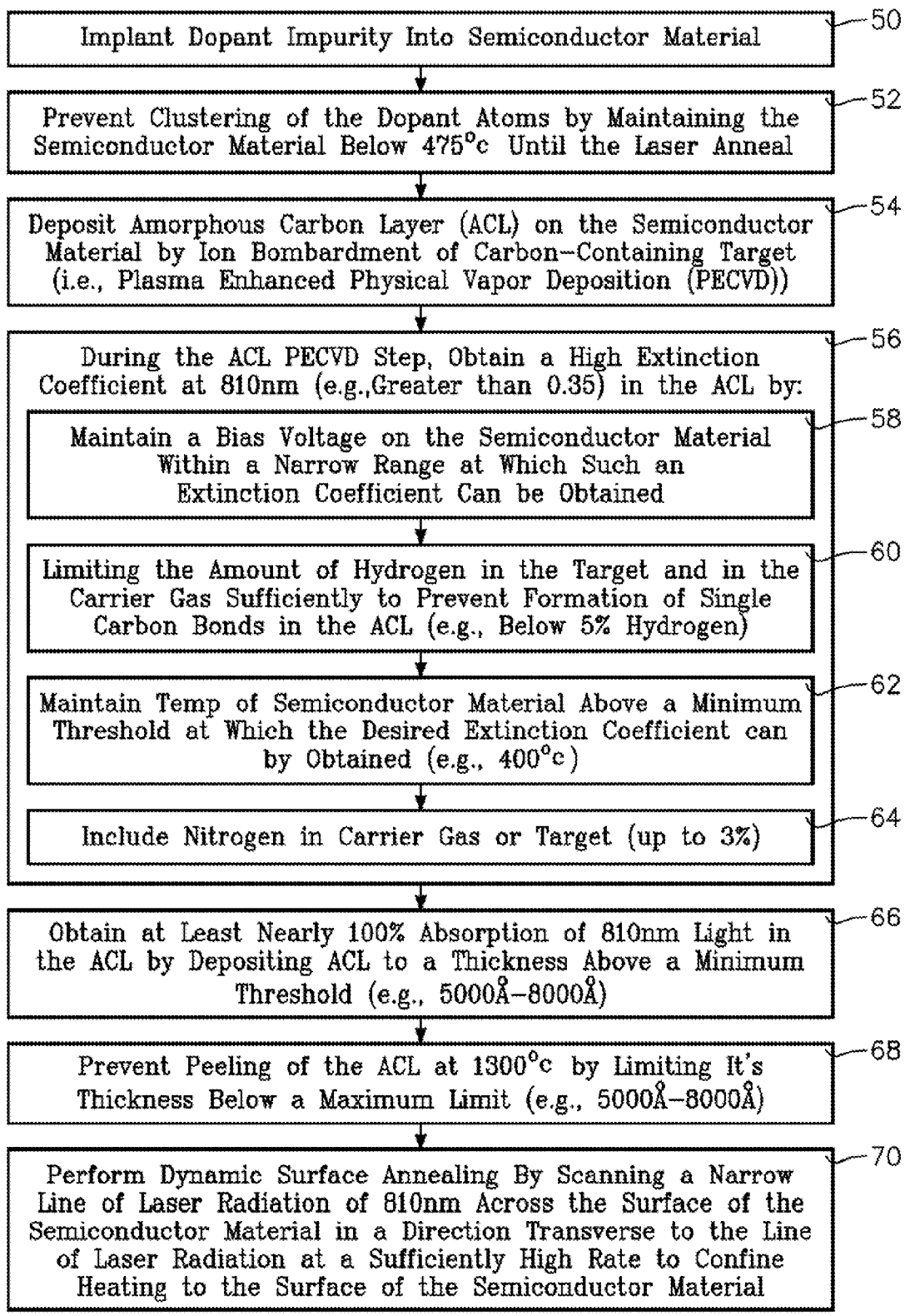
FIG. 2 is a block diagram depicting a process embodying the invention.

Low Temperature Deposition of ACL with Optimum Optical Qualities:

FIG. 1 depicts a plasma reactor chamber for carrying out the plasma enhanced physical vapor deposition process of forming a highly adhesive ACL having a high extinction coefficient at 810 nm. FIG. 2 is a flow diagram of the ACL deposition process. The chamber depicted in FIG. 1 is defined by a vacuum envelope 10 including a ceiling 12 and sidewall 14. A wafer support pedestal 16 supports a semiconductor wafer or workpiece 18 at the floor of the chamber 10 facing the ceiling 12. A carbon-containing target 20 (which may be graphite, for example) is located at the ceiling 12 and faces the wafer support pedestal 16. A "magnetron" 22 is located over the external surface of the ceiling 12 and includes a strong D.C. magnet (not shown) which the magnetron 22 sweeps in-an arcuate motion so that the D.C. magnet scans nearly the entire area of the target 20. A vacuum pump 23 evacuates the chamber to maintain a desired chamber pressure. A D.C. target power source 24 applies approximately 3000 Watts to the target 20. A wafer bias source 26 applies RF bias power through an impedance match element 27 to the wafer support pedestal 16. Gas injection orifices 30 receive a carrier gas from a mass flow controller 32 which is supplied from argon, hydrogen and nitrogen gas supplies 34, 36, 38 through individual mass flow controllers 40, 42, 44.

Referring now to FIG. 2, the semiconductor junction formation process begins by ion implanting a dopant impurity (e.g., boron or arsenic) into the surface of the semiconductor wafer (block 50 of FIG. 2). This step may be carried out by plasma immersion ion implantation or beam ion implantation or a combination of both. Thereafter, and throughout the process, the wafer temperature is maintained below about 475 degrees C. to prevent clustering of the implanted dopant atoms (block 52 of FIG. 2). An amorphous carbon layer (ACL) is deposited as an optical absorber layer on the wafer in a plasma enhanced physical vapor deposition process carried out in the reactor of FIG. 1 (block 54 of FIG. 2). This step entails placing the wafer 18 on the wafer pedestal 16, turning on the D.C. target power source 24 and the bias generator 26, and introducing the process gas through the gas injection orifices 30.

During this step, certain measures are carried out to ensure that the deposited ACL has both high extinction coefficient (e.g., greater than 0.35) at 810 nm and sufficient adhesion and strength to withstand the laser anneal process at 1300 degrees C. (block 56 of FIG. 2):

the bias power generator is set to an output power level that produces a wafer bias voltage preferably between about −6 volts and about −8 volts (block 58 of FIG. 2);

the amount of hydrogen contained in the deposited ACL is limited sufficiently to ensure the formation of predominantly double-carbon bonds throughout the ACL or prevent or suppress formation of single carbon bonds, by either or both (a) limiting the amount of hydrogen contained in the carbon-containing target 20, (b) limiting the amount of hydrogen in the carrier gas, for example to less than 5% (block 60 of FIG. 2);

heating the wafer 18 to a sufficiently high temperature (but less than the dopant clustering threshold temperature) to attain the desired extinction coefficient at 810 nm (block 62);

adding nitrogen to the process gas, as much as 5% (block 64).

The ACL is deposited to a sufficient thickness for the ACL be able to absorb all of the laser radiation, e.g., to a thickness between about 4000 Angstroms and 8000 Angstroms (block 66 of FIG. 2). The thickness of the ACL, however, is limited to minimize stress in the ACL during laser annealing (block 68 of FIG. 2). For this purpose, the upper limit on the ACL thickness is about 8,000-10,000 Angstroms.

Upon completion of the ACL deposition, the wafer is transferred to a dynamic surface anneal apparatus for laser annealing (block 70 of FIG. 2), which is described below.

Figure 3:
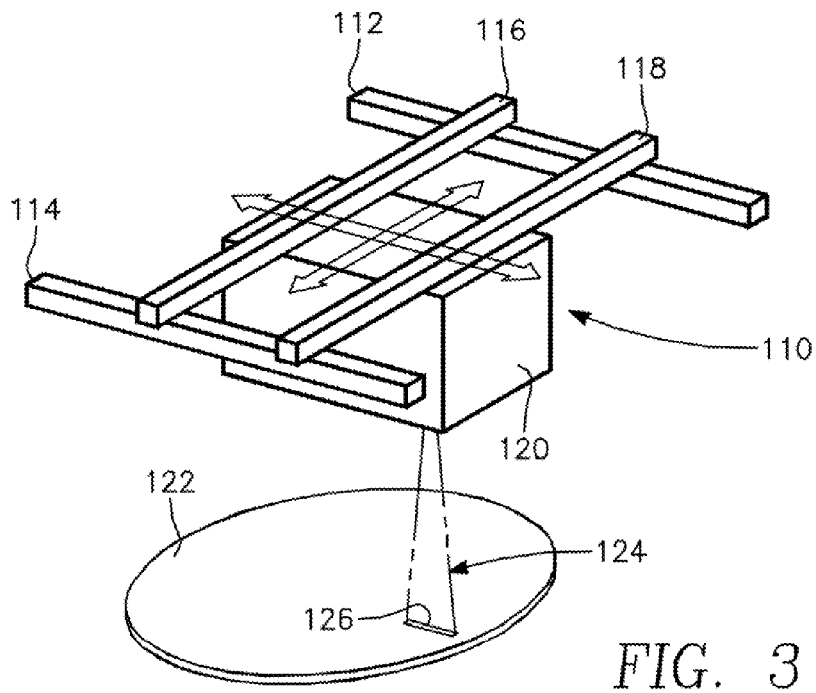
FIG. 3 illustrates a dynamic surface annealing apparatus employed in carrying out other steps in the process of FIG. 2.

Dynamic Surface Annealing:

The dynamic surface anneal step uses a large array of CW 810 nm diode lasers to produce a single intense beam of light that is projected on the wafer surface as a thin long line of radiation. The line is then scanned over the surface of the wafer in a direction perpendicular to the long dimension of the line beam. One embodiment of the light source is illustrated in the schematic orthographic representation of FIG. 3. A gantry structure 110 for two-dimensional scanning includes a pair of fixed parallel rails 112, 114. Two parallel gantry beams 116, 118 are fixed together a set distance apart and supported on the fixed rails 112, 114 and are controlled by an unillustrated motor and drive mechanism to slide on rollers, source, or ball bearings together along the fixed rails 112, 114. A beam source 120 is slidably supported on the gantry beams 116, 118, e.g. suspended below the beams 116, 118 and is controlled by unillustrated motors and drive mechanisms to slide along them. A silicon wafer 122 or other substrate is stationarily supported below the gantry structure 110. The beam source 120 includes laser light source and optics to produce a downwardly directed fan-shaped beam 124 that strikes the wafer 122 as a line beam 126 extending generally parallel to the fixed rails 112, 114, in what is conveniently called the slow direction. Although not illustrated here, the gantry structure further includes a Z-axis stage for moving the laser light source and optics in a direction generally parallel to the fan-shaped beam 124 to thereby controllably vary the distance between the beam source 120 and the wafer 122 and thus control the focusing of the line beam 126 on the wafer 122. Exemplary dimensions of the line beam 126 include a length of 1 cm and a width of 100 microns with an exemplary power density of 400 kW/cm$^2$. Alternatively, the beam source and associated optics may be stationary while the wafer is supported on a stage which scans it in two dimensions.

Figure 4:
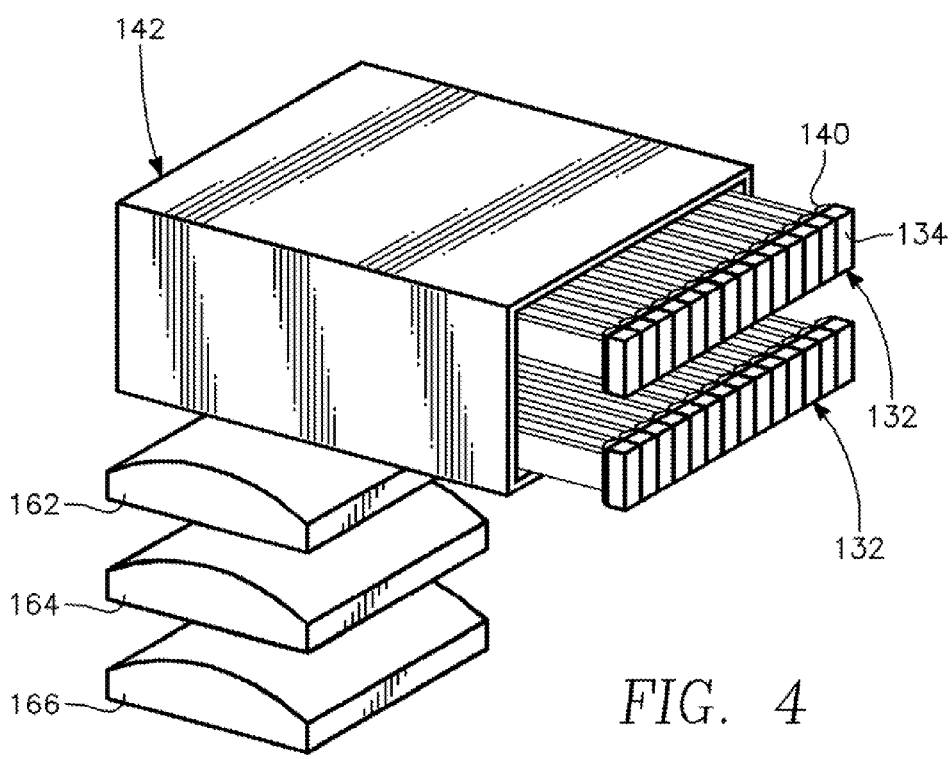
FIG. 4 is a top view of the optics of the apparatus of FIG. 3.
Figure 5:
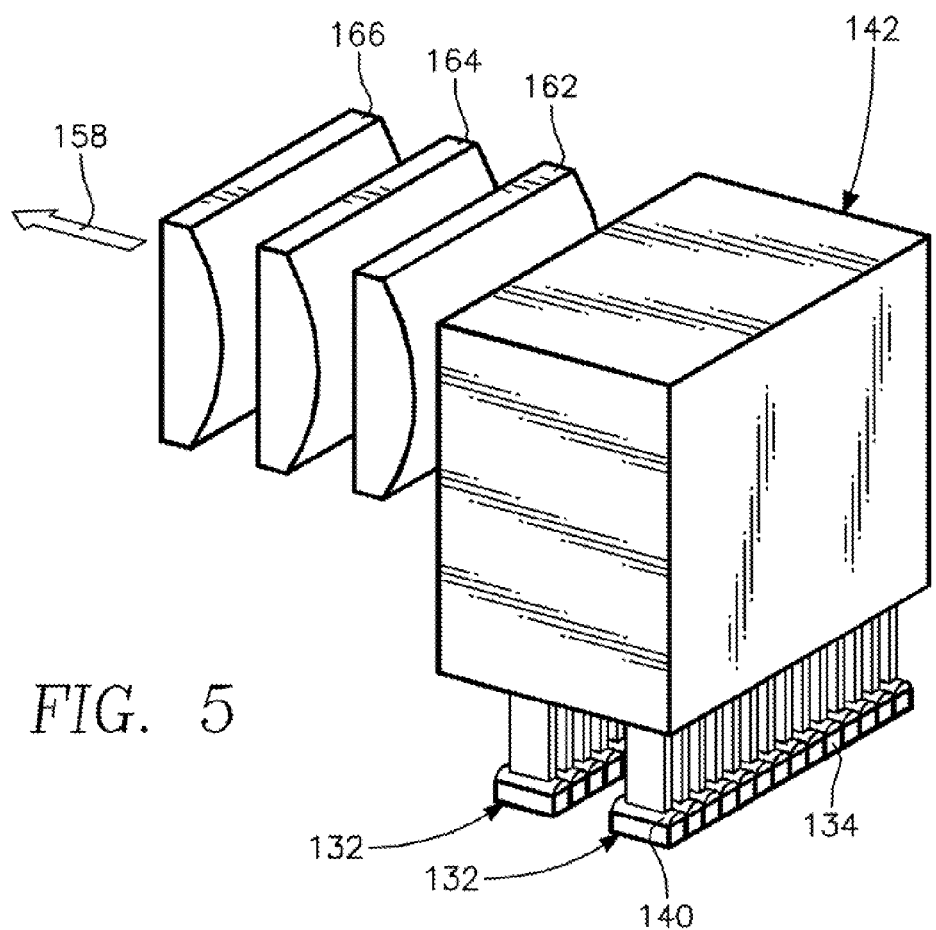
Figure 6:
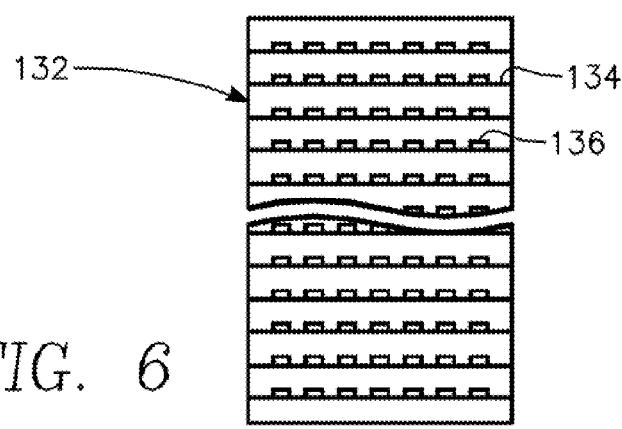
FIG. 6 is a broken sectional view of the laser array employed in the apparatus of FIG. 3.

In typical operation, the gantry beams 116, 118 are set at a particular position along the fixed rails 112, 114 and the beam source 120 is moved at a uniform speed along the gantry beams 116, 118 to scan the line beam 126 perpendicularly relative to its long dimension in a direction conveniently called the fast direction. The line beam 126 is thereby scanned from one side of the wafer 122 to the other to irradiate a 1 cm swath of the wafer 122. The line beam 126 is narrow enough and the scanning speed in the fast direction fast enough that a particular area of the wafer is only momentarily exposed to the optical radiation of the line beam 126 but the intensity at the peak of the line beam is enough to heat the surface region to very high temperatures. However, the deeper portions of the wafer 122 are not significantly heated and further act as a heat sink to quickly cool the surface region. Once the fast scan has been completed, the gantry beams 116, 118 are moved along the fixed rails 112, 114 to a new position such that the line beam 126 is moved along its long dimension extending along the slow axis. The fast scanning is then performed to irradiate a neighboring swath of the wafer 122. The alternating fast and slow scanning are repeated, perhaps in a serpentine path of the beam source 120, until the entire wafer 122 has been thermally processed. One example of optics beam source 120, orthographically illustrated in FIGS. 4 and 5, receives laser radiation at about 810 nm from two laser bar stacks 132, one of which is illustrated in end plan view in FIG. 6. Each laser bar stack 132 includes 14 parallel bars 134, generally corresponding to a vertical p-n junction in a GaAs semiconductor structure, extending laterally about 1 cm and separated by about 0.9 mm. Typically, water cooling layers are disposed between the bars 134. In each bar 134 are formed 49 emitters 136, each constituting a separate GaAs laser emitting respective beams having different divergence angles in orthogonal directions. The illustrated bars 134 are positioned with their long dimension extending over multiple emitters 136 and aligned along the slow axis and their short dimension corresponding to the less than 1-micron p-n depletion layer aligned along the fast axis. The small source size along the fast axis allows effective collimation along the fast axis. The divergence angle is large along the fast axis and relatively small along the slow axis.

Returning to FIGS. 4 and 5, cylindrical lenslets 140 are positioned along the laser bars 134 to collimate the laser light in a narrow beam along the fast axis. They may be bonded with adhesive on the laser stacks 132 and aligned with the bars 134 to extend over the emitting areas 136. The two sets of beams from the two bar stacks 132 are input to conventional optics 142. The source beam 158 is then passed through a set of cylindrical lenses 162, 164, 166 to focus the source beam 158 along the slow axis.

Working Examples:

The following are working examples of the plasma enhanced physical vapor deposition process of block 54 of FIG. 2. In the first example, no nitrogen was present in the process gas, and a good extinction coefficient at 810 nm was obtained by employing a negative wafer bias in a narrow range of about −6 to −8 volts. In the second example, nitrogen was used in the process gas, and a good extinction coefficient at 810 nm was obtained by employing a positive wafer bias of about +10 volts.

First example: The process parameters were set as follows: D.C. target power: 3,000 Watts, chamber pressure: 6 milliTorr, wafer bias voltage: −6 volts to −8 volts, process gas: 100% Argon, target material: graphite, wafer temperature: 65 degrees C. The characteristics of the ACL were as follows: transmittance at 810 nm: 12%-14%, extinction coefficient: 0.51, thickness: 2600 Angstroms, deposition rate: 150 Angstroms/minute, sidewall thickness to top thickness ratio: 20%, bottom thickness to top thickness ratio: 30%. Damage at 1300 degrees C. during laser annealing: none.

Second example: The process parameters were set as follows: D.C. target power: 3,000 Watts, chamber pressure: 6 milliTorr, wafer bias voltage: +10 volts, process gas: 97% Argon and 3% Nitrogen, target material: graphite, wafer temperature: 65 degrees C. The characteristics of the ACL were as follows: transmittance at 810 nm: 3.5%, extinction coefficient: 0.67, thickness: 4000 Angstroms, deposition rate: 200 Angstroms/minute, sidewall thickness to top thickness ratio: 25%, bottom thickness to top thickness ratio: 50%. Damage at 1300 degrees C. during laser annealing: none.

The extinction coefficient at 810 nm obtained in the second working examples is double that obtained in the high temperature PECVD process described in the background discussion above. This improvement permits the ACL thickness to be reduced by a factor of two to obtain the same percentage absorption of the incident laser power (e.g., 90-99%). For a given absorption (e.g., 99%) of the incident laser power in the ACL, the required ACL thickness depends directly upon the extinction coefficient. For example, in order to absorb 99% of the incident laser power, an ACL with an extinction coefficient of 0.55 must be 5400 Angstroms thick while an ACL with an extinction coefficient of only 0.35 (obtained in the conventional PECVD process described in the background discussion above) must be 8700 Angstroms thick. The dramatic reduction in required ACL thickness achieved in the present invention (by the improvement in extinction coefficient) renders the ACL much more durable and impervious to peeling, separation or cracking during the laser annealing step. This is because the stress on the ACL laser during its inevitable expansion and contraction with the scanning laser line beam is a direct function of the ACL thickness. Therefore, the improvement in extinction coefficient obtained in the invention has the direct advantage of higher or more efficient absorption and the indirect advantage of permitting a thinner ACL to reduce stress during the laser anneal.

Several process parameters are exploited in our process to produce an ACL with a higher extinction coefficient at 810 nm. First, the bias power applied to the wafer support pedestal preferably is set at a level at which the wafer bias voltage is on the order of +10 volts (e.g., in a range between +9 volts and +11 volts) if nitrogen is present in the process gas, and in a range of −6 to −8 volts if nitrogen is not employed in the process gas. It is our discovery that such narrow ranges of wafer bias maintained during the PEPVD process 54 of FIG. 2 is essential to an improved extinction coefficient in the ACL. Limiting the bias voltage in this manner has the further advantages of reducing stress in the ACL during laser annealing and minimizing the amount of carbon atoms inadvertently implanted in the wafer during the PEPVD process 54 of FIG. 2. Secondly, the extinction coefficient is improved by adjusting process conditions during the PEPVD process 54 of FIG. 2 to promote the greatest proportion of double carbon bonds in the ACL. One way of accomplishing this is to minimize the amount of hydrogen in the process gas and in the carbon-containing target 20 of FIG. 2. In the working examples given above, no hydrogen was included in the process gases while the amount of hydrogen in the carbon-containing target was negligible. Another way of enhancing the extinction coefficient is to include a small amount of nitrogen in either the process gas or in the carbon-containing target. This promotes the formation of carbon-nitrogen bonds in the ACL, which contribute to optical absorption at 810 nm. In the second example, the process gas contained 3% nitrogen. In another embodiment, the carbon-containing target may contain a similar proportion of nitrogen.

The wafer temperature during the PEPVD step 54 of FIG. 2 may be increased to improve step coverage of the ACL provided the wafer temperature is maintained below 475 degrees C.

While the invention has been described in detail by specific reference to preferred embodiments, it is understood that variations and modifications thereof may be made without departing from the true spirit and scope of the invention.

What is claimed is:

1. A process for depositing an amorphous carbon layer on an ion-implanted wafer for use in dynamic surface annealing of the wafer with an intense line beam of a laser wavelength, comprising:
   (a) introducing the wafer into a chamber such that a carbon-containing solid target overlies the wafer, and furnishing a process gas into the chamber;
   (b) generating a bias voltage on the wafer from a bias voltage source,
   (c) applying target source power to the carbon-containing solid target overlying said wafer to produce ion bombardment of the carbon-containing solid target;
   (d) setting said bias voltage so that the amorphous carbon layer that is deposited has a desired extinction coefficient at said laser wavelength.

2. The process of claim 1 wherein said laser wavelength is 810 nm.

3. The process of claim 1 wherein said desired extinction coefficient is in excess of 0.5, said process gas comprises an inert gas and said bias voltage is between about −8 and −6 volts.

4. The process of claim 1 wherein said desired extinction coefficient is in excess of 0.6 and, said process gas comprises an inert gas and nitrogen, and said bias voltage is between about +9 volts and +11 volts.

5. The process of claim 1 wherein said process gas comprises an inert gas, and further comprising adding nitrogen gas to said process gas.

6. The process of claim 1 further comprising-including nitrogen in said carbon-containing target.

7. The process of claim 1 wherein said carbon-containing target comprises graphite.

* * * * *